(12) United States Patent
Pentakota et al.

(10) Patent No.: US 7,113,117 B1
(45) Date of Patent: Sep. 26, 2006

(54) REDUCING THE EFFECT OF NOISE PRESENT ALONG WITH AN INPUT SIGNAL WHEN SAMPLING THE INPUT SIGNAL

(75) Inventors: Visvesvaraya A Pentakota, Bangalore (IN); Nitin Agawal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/163,101

(22) Filed: Oct. 5, 2005

(51) Int. Cl.
*H03M 1/00* (2006.01)

(52) U.S. Cl. .................................. 341/123; 341/122
(58) Field of Classification Search ................ 341/123, 341/118, 122

See application file for complete search history.

(56) References Cited

U.S. PATENT DOCUMENTS 4,375,625 A * 3/1983 Lee ........................... 333/213
6,603,415 B1 * 8/2003 Somayajula ................. 341/118

* cited by examiner

*Primary Examiner*—Rexford Barnie
*Assistant Examiner*—Joseph Lauture
(74) *Attorney, Agent, or Firm*—W. James Brady, III; Frederick J. Telecky, Jr.

(57) ABSTRACT

An aspect of the present invention reduces the effect of any noise present along with an input signal when sampling the input signal by charging each of several parallel connected capacitors for different time durations with at least some non-overlap. In an embodiment, such an approach is used in a switched capacitor amplifier circuit of an ADC. The capacitors in that embodiment start charging at the same time instance, but stop charging at different time instances due to the design of associated switches and control signals.

20 Claims, 10 Drawing Sheets

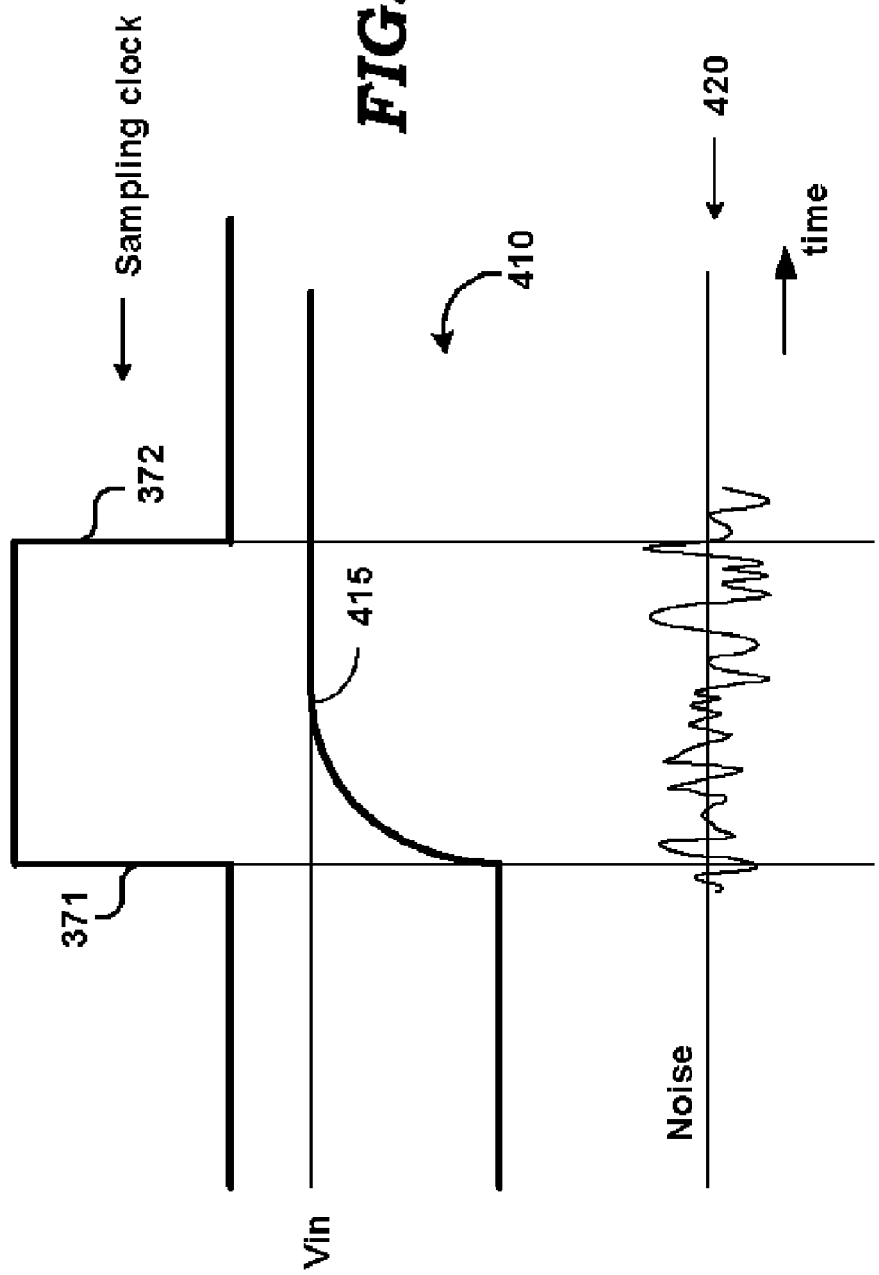

REDUCING THE EFFECT OF NOISE PRESENT ALONG WITH AN INPUT SIGNAL WHEN SAMPLING THE INPUT SIGNAL

BACKGROUND

1. Field of the Invention

The present invention relates to integrated circuit design, and more specifically to a method and apparatus for reducing the effect of noise present along with an input signal when sampling the input signal.

2. Related Art

Sampling generally refers to capturing the strength of a signal at a time instance of interest. Capacitor circuits connected in parallel are often used to sample the voltage level of an input signal. One desirable feature of such sampling is that the effect of any noise present along with the input signal (on a path) be reduced/avoided when performing such sampling operations, as described with reference to an ADC.

FIG. 1 is a block diagram of a prior ADC used to illustrate the need to reduce the effect of any noise present along with an input when performing sampling operations. ADC 100 is shown containing sample and hold amplifier (SHA) 110, stages 120-1 through 120-S and digital error correction block 130. Each block is described below in further detail.

SHA 110 samples input signal received on path 134 and holds the voltage level of the sample for further processing. Each stage 120-1 through 120-S generates a sub-code corresponding to a voltage level of an analog signal received as an input, and an amplified residue signal as an input to a (any) next stage. Digital error correction block 130 receives sub-codes from various stages, and generates a digital code (on path 146) corresponding to the sample received on path 134.

FIG. 2 further illustrates the logical operation of each stage (described with reference to stage 120-1 only, for conciseness) according to a prior approach. Stage 120-1 is shown containing flash ADC 250, digital to analog converter (DAC) 260, subtractor 270 and gain amplifier 280. Flash ADC 250 (an example of a quantizer) converts a sample of an analog signal received on path 111 into a corresponding P-bit sub-code provided on path 256. DAC 260 converts the sub-code received on path 256 into corresponding analog signal (Vdac) on path 267.

Subtractor 270 generates a residue signal as the difference of sample 111 (Vi) and the analog signal received on path 267 (Vdac). Gain amplifier 280 amplifies the residue signal (Vi-Vdac), which is provided on path 112 as an amplified residue signal. The signal on path 112 is used to resolve the remaining bits in the N-bit digital code by the subsequent ADC stages.

Subtractor, DAC, and gain amplifier may be implemented using a capacitor network and an operational amplifier together operating as a switched capacitor amplifier. One prior switched capacitor amplifier implementing substracter 270, DAC 260, and gain amplifier 280 of stage 120-1 is described below with respect to FIGS. 3A and 3B.

FIG. 3A is an example switched capacitor amplifier illustrating combined implementation of DAC 260, subtractor 270, and gain amplifier 280 in one prior embodiment. FIG. 3B is a timing diagram depicting the sample and hold phases used in the operation of the circuit of FIG. 3A. The circuit diagram is shown containing op-amp 350, feedback capacitor 360, feedback switch 380 and circuit portions 301-1 through 301-2". Circuit portions 301-1 is shown containing sampling capacitor 330-1, switch 310A-1, 310B-1 and 310C-1. The remaining circuit portions 310-2 through 310-2" may also contain similar components, and are not described in the interest of conciseness. Each component is described below in further details.

The circuit in FIG. 3A operates using two phase signals, shown as sampling phase clock 370 and hold phase clock 390. In the first phase (sampling phase 370) switches 310A-1 through 310A-2" are closed at time points 371 and the remaining switches 380, 310B-1 through 310B-2", and 310C-1 through 310C-2" are kept open. As a result, each sampling (input) capacitor 330-1 through 330-2" is ideally charged (in duration between 371–372) to the voltage of input sample received on path 111 by time point 372.

In the second phase (between durations 391–392), feedback switch 380 is closed and switches 310A-1 through 310A-2" are kept open. Connections of switches 310B-1 through 310B-2", and 310C-1 through 310C-2" are made such that the input terminals of each sampling capacitor 330-1 through 330-2" is connected either to Vref or to REFCM terminal, as determined from the output of flash ADC 250.

As a result, each of capacitors 330-1 through 330-2" transfers a charge proportional to the difference (residue) of input signal and the Vref or REFCM to feedback capacitor 360 (up to time point 392). The residue is amplified by op-amp 350 and provided as amplified residue signal to the next stage, as desired.

However, the input voltage provided on path 111 may contain various types of noise such as amplifier noise generated by SHA 110, noise generated by switches and other components, etc. Each sampling capacitor 330-1 through 330-2" samples the input signal along with the noise components present on path 111. The manner in which sampling capacitors sample both input signal and associated noise components is illustrated in FIG. 4.

FIG. 4 is a graph illustrating manner in which noise is sampled in addition to the analog input signal. The graph is shown containing sampling clock 370, input signal 430 and noise 450. Merely for illustration, the input signal and noise are shown as two separate signals. However, a cumulative signal (of input signal 430 and noise 450) is generally presented on path 111.

At time point 371, switches 310A-1 through 310A-2" are closed. As a result, the voltage on the sampling terminal of the capacitors (330-1 through 330-2") starts increasing, and settles to the sampled input value (Vin) at time point 402. The input voltage remains a constant thereafter.

A noise signal (random) is shown varying randomly with respect to time and typically having zero mean value and a finite root mean square value. Due to the opening of switches at time point 372, each capacitor stores a (cumulative) voltage equaling the sum of settled input value (vin) and a noise value (with the root mean squared (RMS) value of the noise at the sampling time point).

Since each capacitor samples the noise between the same time points, the noise magnitudes sampled by the capacitors are correlated to each other (or same). As a result, the noise sampled by each sampling capacitor gets added at the input of the amplifier.

Accordingly, during hold phase (between time point 391 and 392), the amplified sum total of noise (sum of the noise sampled (N1) by all sampling capacitors 330-1 through 330-2") is presented at the output of op-amp 350. Such noise propagation can cause an error in the residue signal and/or quantization, resulting in error in the sub-codes generated by various stages.

Therefore, what is needed is a method and apparatus for reducing the effect of noise present along with an input signal when sampling the input signal.

BRIEF DESCRIPTION OF THE DRAWINGS

The present invention will be described with reference to the following accompanying
drawings.

FIG. 4 is a graph illustrating manner in which noise is sampled in addition to the analog input signal.

In the drawings, like reference numbers generally indicate identical, functionally similar, and/or structurally similar elements. The drawing in which an element first appears is indicated by the leftmost digit (s) in the corresponding reference number.

DETAILED DESCRIPTION

1. Overview

An aspect of the present invention reduces the effect of noise by sampling an input signal using multiple capacitors connected in parallel, with different capacitors being charged by the input signal for different time durations, with at least some non-overlap. Such a feature can be used in switched capacitor amplifier circuits also, as described below.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Reducing Noise Propagation

Figure 1:
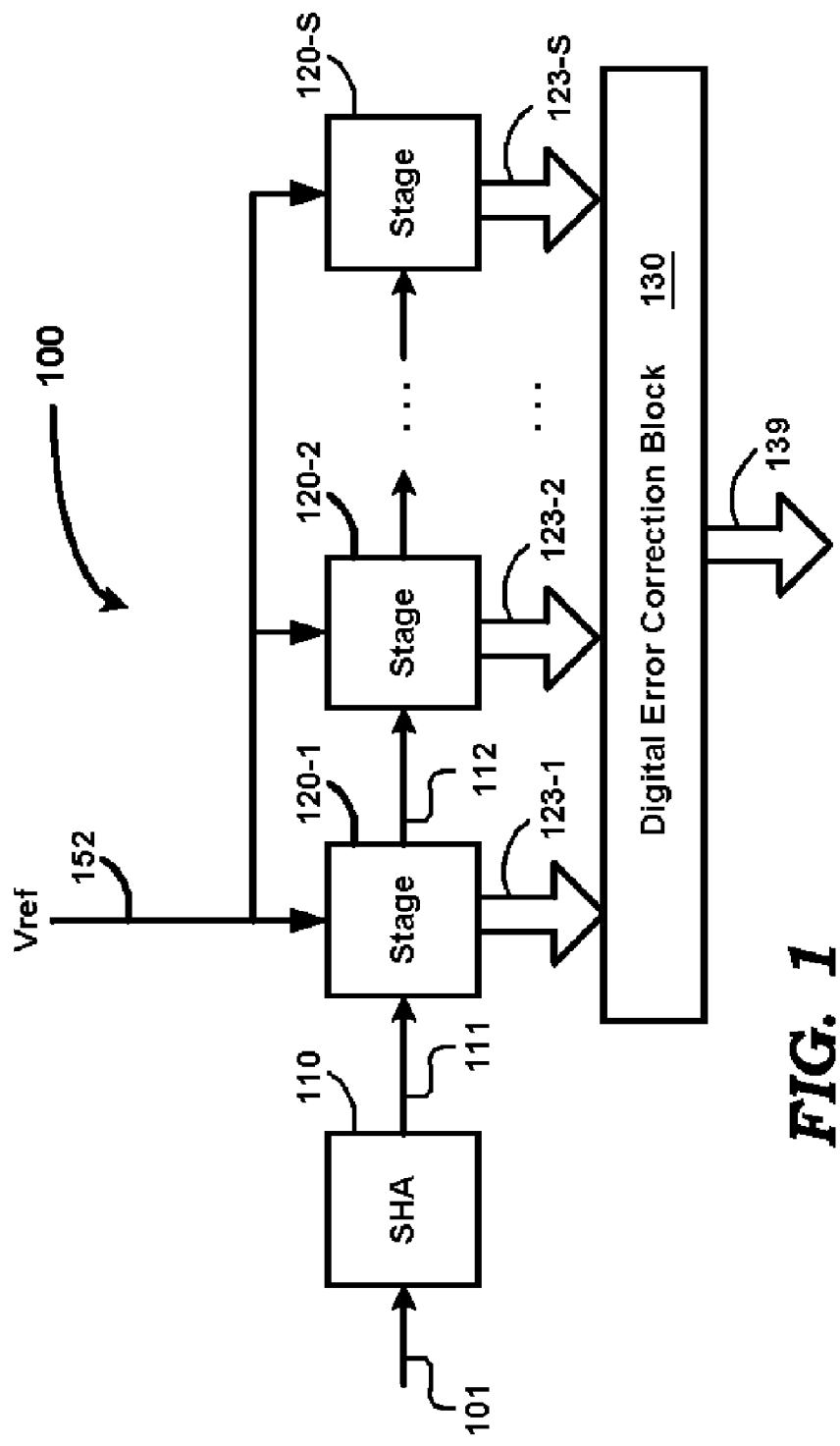
FIG. 1 is a block diagram of an example pipeline ADC implementing a switched capacitor amplifier according to a prior approach.
Figure 2:
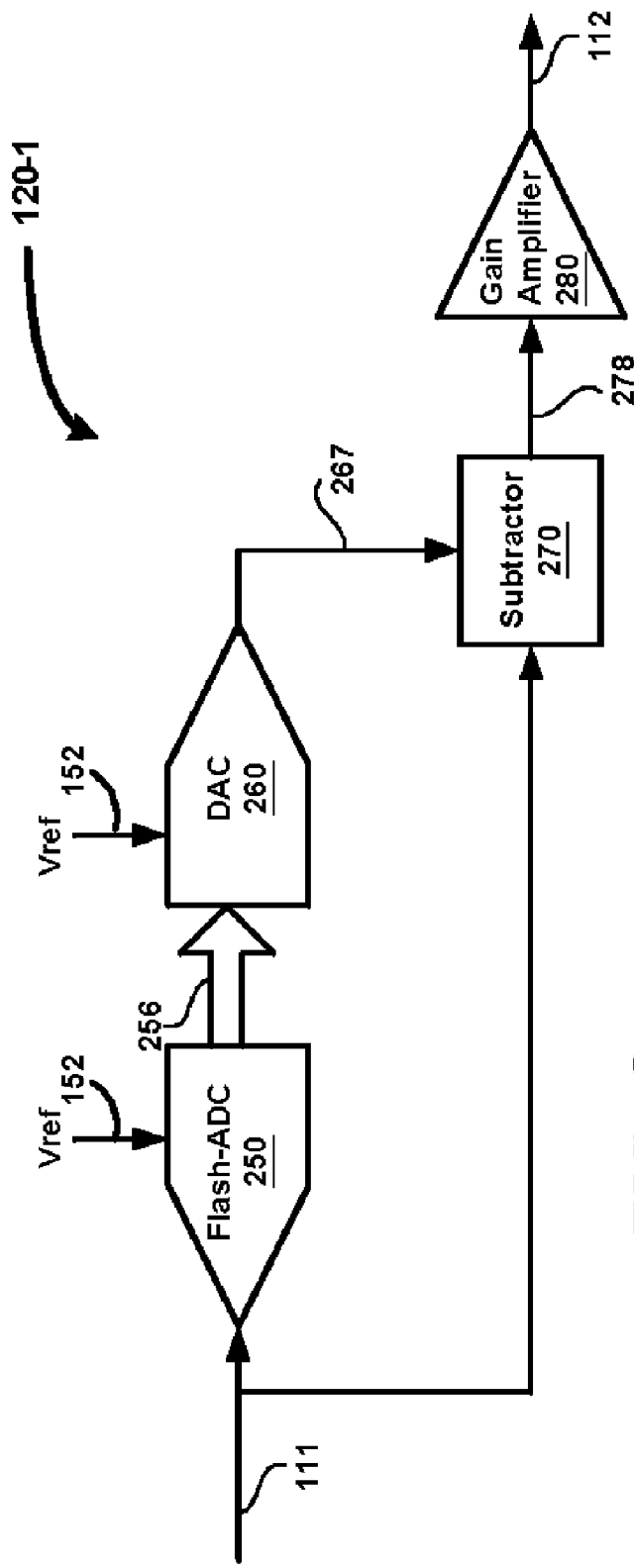
FIG. 2 is a block diagram illustrating the general operation of a stage of a prior ADC.
Figure 3A:
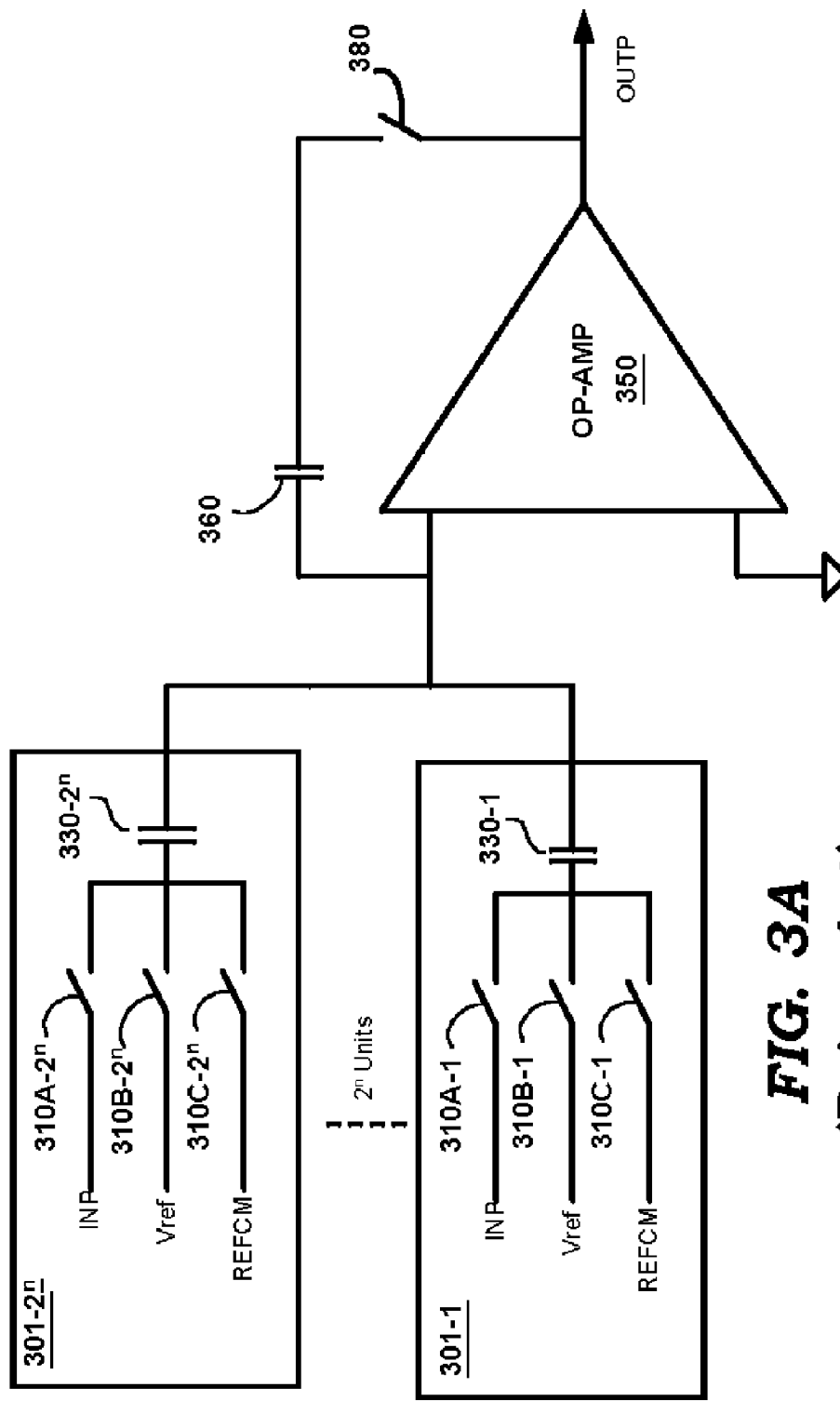
FIG. 3A is an example switched capacitor amplifier illustrating combined implementation of DAC, subtractor, and gain amplifier in one prior embodiment.
Figure 3B:
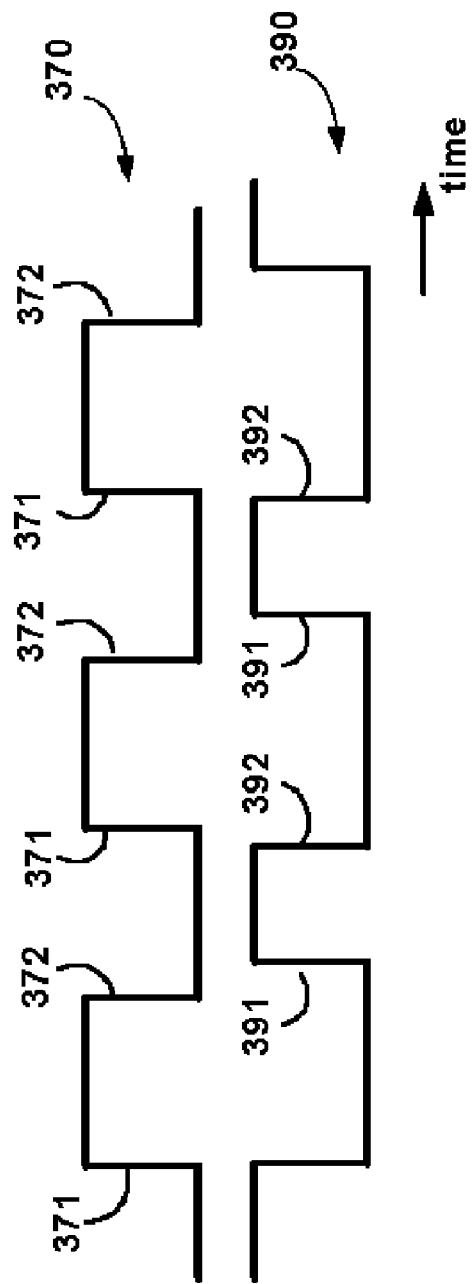
FIG. 3B is a timing diagram depicting the sample and hold phases used in the operation of the circuit of FIG. 3A.
Figure 5:
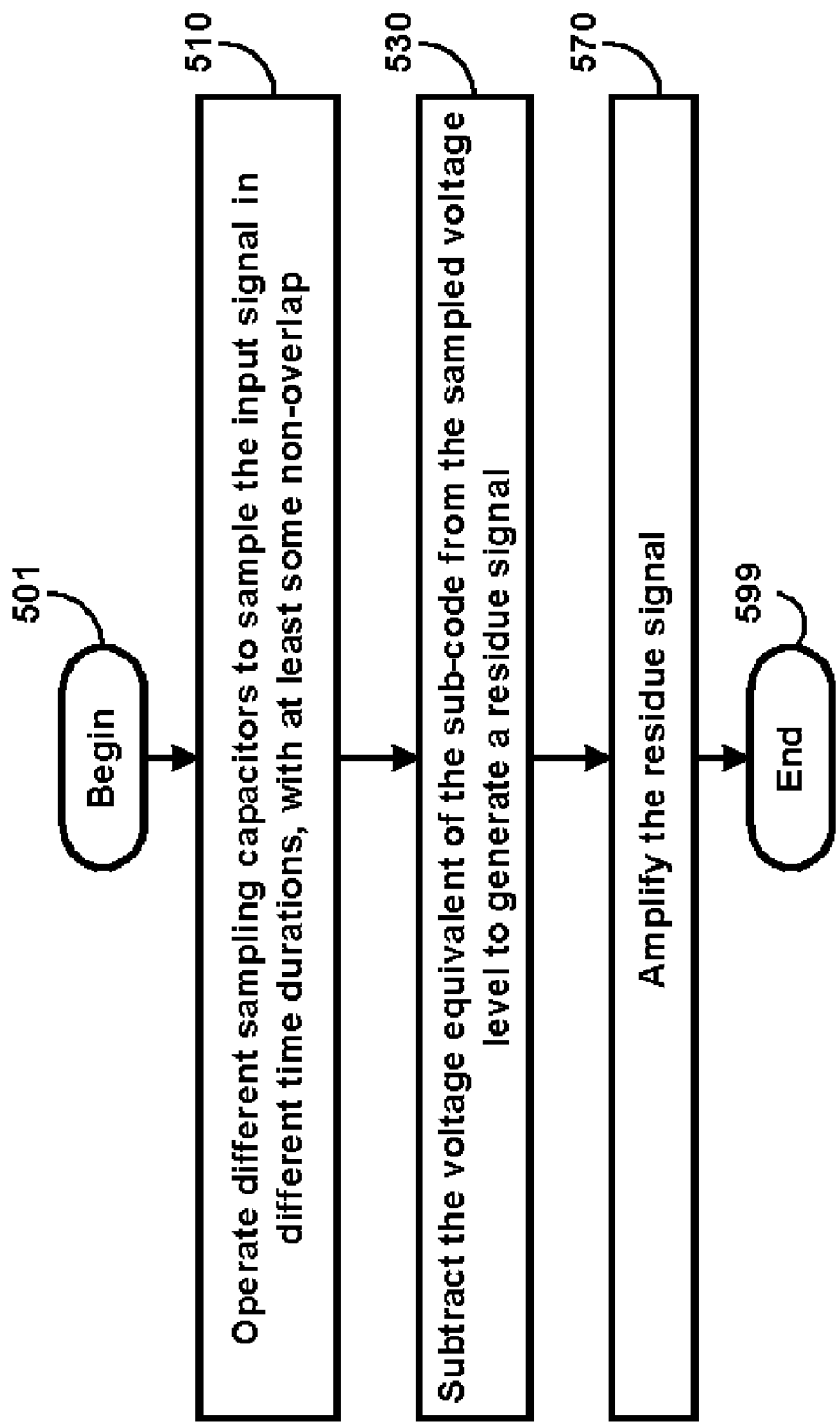
FIG. 5 is a flow chart illustrating the manner in which propagation of noise present in an input signal can be reduced in a switched capacitor environment, according to various aspects of the present invention.

FIG. 5 is a flow chart illustrating the manner in which propagation of noise present in an input signal can be reduced in a switched capacitor environment, according to various aspects of the present invention. Merely for illustration, the features are described with reference to the ADC of FIG. 3A. The flowchart begins with step 501 and control immediately passes to step 510.

In step 510, operate different sampling capacitors to sample the input signal in different time durations, with at least some non-overlap. Such non-overlap can be attained by using sampling clock signals, having edges at different time instances. In an embodiment described below, the falling edge of a sampling clock is made to occur at different time instances for different sampling capacitors.

In step 530, the switched capacitor amplifier subtracts the voltage equivalent of the sub-code (received from a quantizer, in this case flash-ADC 250) from the sampled voltage level to generate a residue signal.

In step 570, the switched capacitor amplifier amplifies the residue signal and provides the amplified residue signal as output. The flowchart end in step 599. Due to the use of different time durations as described above, the noise sampled by each sampling capacitor is uncorrelated (not the same). As a result, the sum total of the noise contributed by all the sampling capacitors may be less than in the embodiments of FIGS. 3A/3B.

The approaches described above can be implemented in various embodiments. Example embodiments are described below in further detail for illustration.

3. Reducing Noise

Figure 6A:
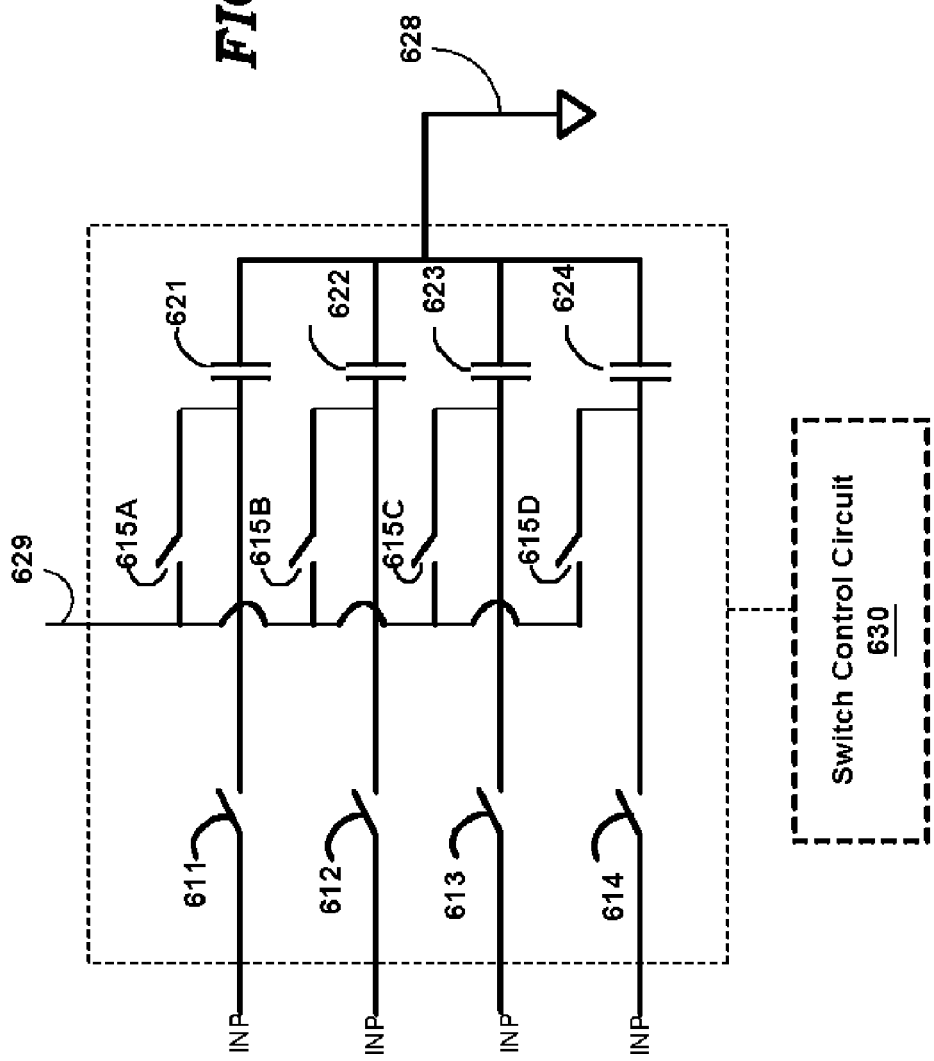
FIG. 6A is a circuit diagram of a switched capacitor amplifier in an embodiment of the present invention.

FIG. 6A is a circuit diagram of a switched capacitor sampling circuit in an embodiment of the present invention. The circuit diagram is shown containing sampling capacitors 621–624 (connected in parallel), switches 611–614 and 615A–615D and switch control circuit 630. Each component is described below in further detail.

Switches 611–614 respectively connects capacitors 621–624 to the input signal (on inp path) when turned on (making contact) and disconnects from the input signal when turned off. Each capacitor 621–624 samples input signal and noise present in the INP path along with the input signal when the corresponding switches are turned on.

Switch control circuit 630 turns on switches 611–614 at same time and turns off each switch 611–614 at different time point. Switches 615A–615D are kept open till all the switches 611–614 are opened. As a result of operation of switches 611–614 and 615A–615D, each capacitor samples the input signal for different time durations starting at the same time point. Due to such different sampling durations, each capacitor samples an input signal of same value (assuming the input signal has settled before any one switch 611–614 is turned off) and an un-correlated noise value.

Switch control circuit 630 closes switches 615A–615D after all the switches 611–614 are opened. As a result, the voltage provided on path 629 contains a signal component proportionate to the strength of the settled input signal sampled by each capacitor and a noise component proportionate to the sum total of an un-correlated noise which is less than the sum total of the correlated noise.

The approaches of above can be adapted to ADCs as described below with respect to an alternative embodiment.

4. Alternative Embodiment

Figure 6B:
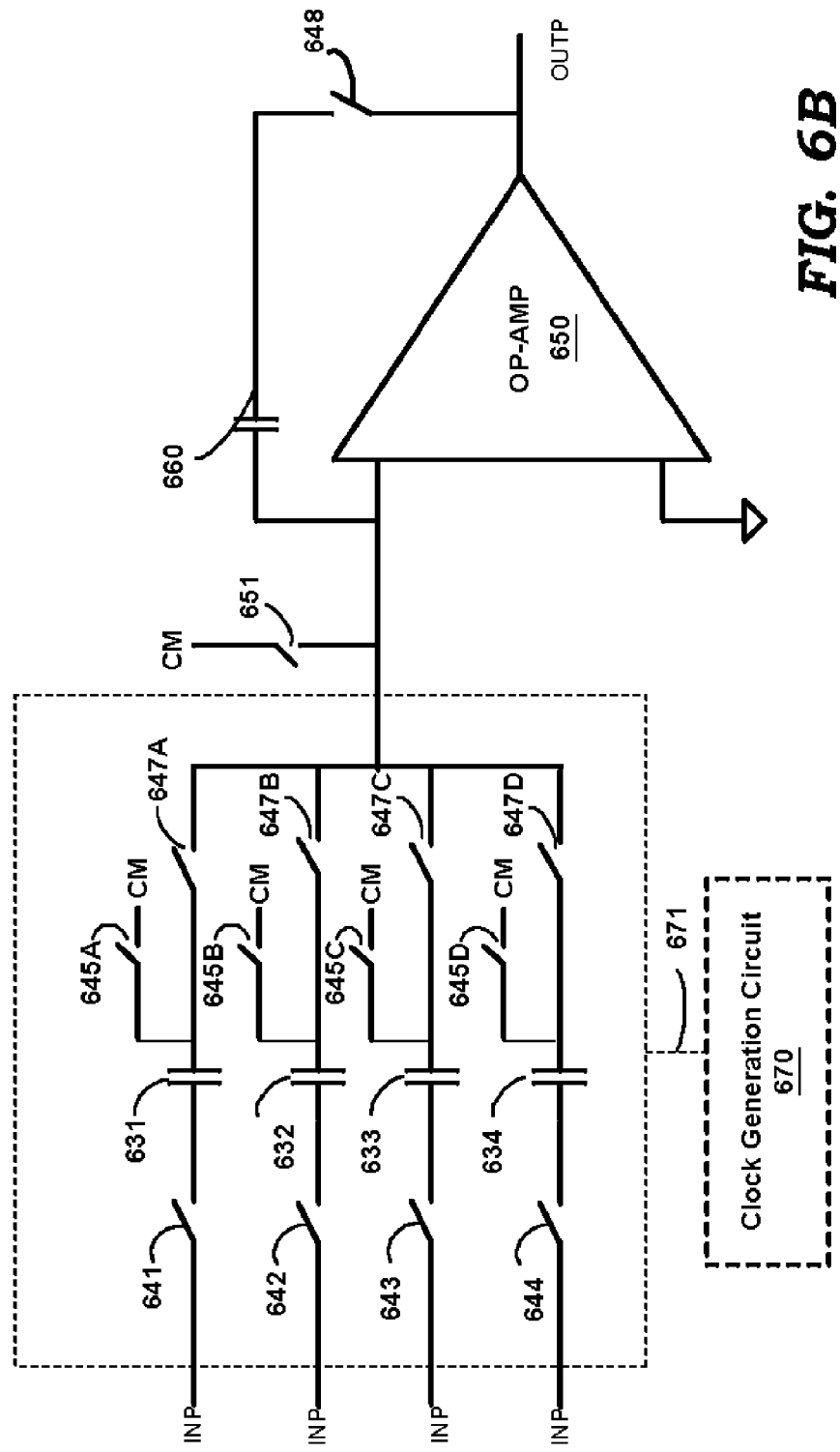
FIG. 6B is a circuit diagram of a switched capacitor amplifier in another embodiment of the present invention.

FIG. 6B is a circuit diagram of a switched capacitor amplifier in an embodiment of the present invention. The circuit diagram is shown containing sampling capacitors 631–634, switches 641–644, 645A–645D, 647A–647D, 648 and 651, operational amplifier 650, feedback capacitor 660 and clock generation circuit 670. Each component is described below in further detail.

During sampling phase (between time point 371 and 372), capacitors 631–634 operate as sampling capacitors.

Switches 641–644 connects one terminal of the corresponding capacitor to the input signal INP and switches 645A–645D connects other terminal of the corresponding capacitors to common mode voltage CM. During this time, switches 647A–647D are open (disconnected) and amplifier's input is connected to common mode using switch 651.

Multiple sampling clocks (from clock generation circuit 670 on path 671) operate to close and open switches 641–644 and 645A–645D. Accordingly, each capacitor 631–634 samples input signal when corresponding one of switches 641–644 along with corresponding one of switches 645A–645D are closed (making contact). Capacitors 631–634 stops sampling when the corresponding switches are opened.

During hold phase (between time point 391 and 392), switches 641–644 and switches 645A–645D are opened, and the sampling terminal of each capacitor 631–634 is connected to a reference voltage using a set of switches (not shown). Other terminal of the capacitor 631–634 are connected to one of the input terminals of the operational amplifier 650 using switches 647A–647D. The difference of sampled signal voltage and the reference voltage CM is amplified through feedback capacitor 660 by closing switches 647A–647D and 648.

Clock generation circuit 670 generates multiple sampling clock signals, which cause sampling capacitors 631–634 to have different sampling durations (as noted above with respect to step 510). Due to such different sampling durations, the sum total of an un-correlated noise is less than the sum total of the correlated noise (of FIGS. 3A/3B) as is well known in the relevant arts. As a result, the total noise propagated on OUTP is reduced. The clock signals generated by clock generation circuit 670 in an example embodiment are further illustrated with respect to FIG. 7.

5. Reducing Noise Propagation Due to Clock Signals

Figure 7:
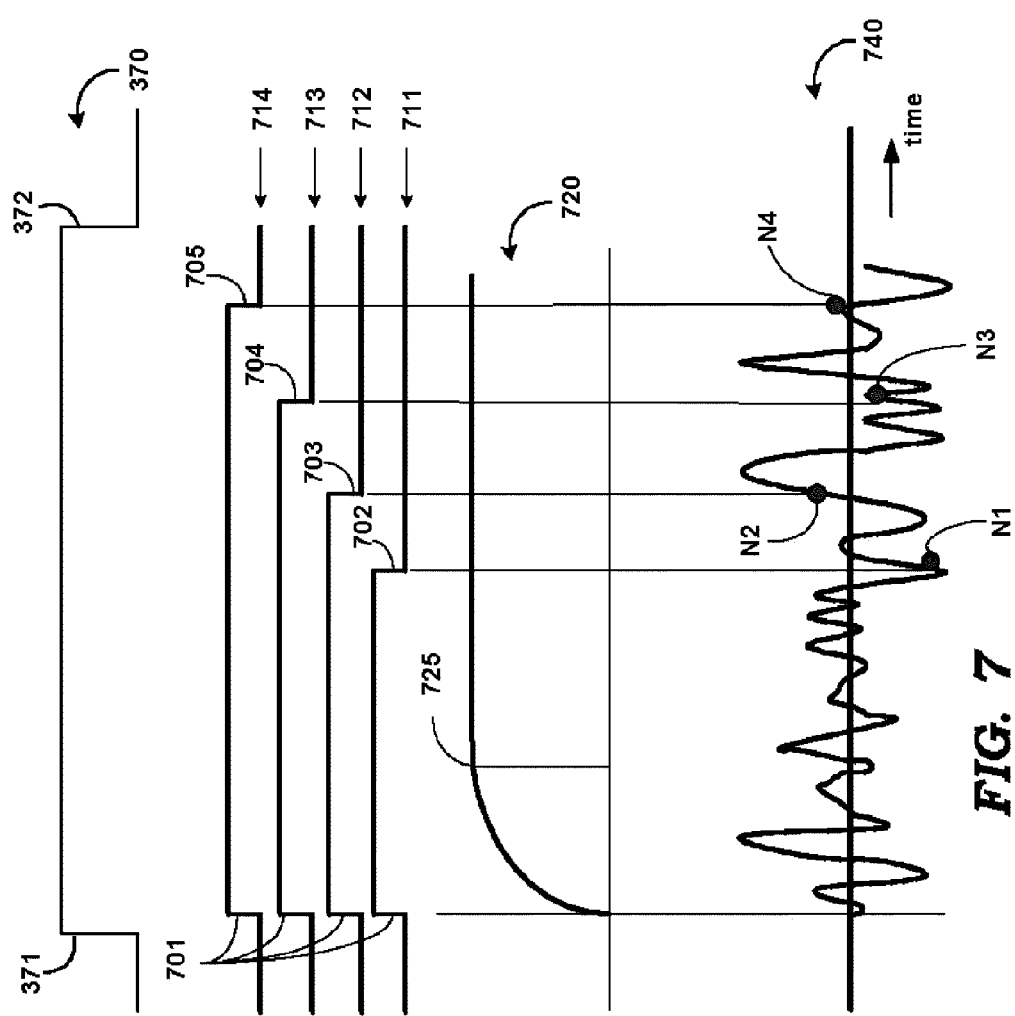
FIG. 7 is a graph illustrating an example set of clock signals (generated in an embodiment of the present invention), in addition to the manner in which noise propagation is reduce.

FIG. 7 is a graph illustrating an example set of clock signals (generated in an embodiment of the present invention), in addition to the manner in which noise propagation is reduce. The graph is shown containing sampling clock signal 370 (repeated here for comparison), multiple sampling clock signals 711–714 (generated by clock generation circuit 670, for example, in a known way), input signal 720 and noise signal 740. Each signal and the corresponding operations are described below with reference to FIG. 6 in further detail.

Signal 370 provides outer bounds for the start and end of sampling activity in each cycle (typically due to design constraints). Thus, the sampling may be started after time point 371 and all sampling operation are completed before time point 372.

Input signal 720 is shown increasing and settling at value Vin at time point 725. Input signal 720 is shown being (substantially) constant at Vin after time point 725.

Clock signals 711–714 are shown having a rising edge at same time point 701, however the clock signals are respectively shown having falling edges at different time points 702, 703, 704 and 705 respectively. The falling edges of the clock is shown occurring after input settling time point 725 (similar to time point 415).

A random noise signal is shown having values N1, N2, N3, and N4 respectively at time points 702, 703, 704 and 705. The operation is described below with respect to FIGS. 6A/6B.

Clock signals 711–714 operate switches 641–644 (of FIG. 6B) respectively. Switches 641–644 are closed at rising edge 701 and opened respectively by respective falling edges 702–705. Switch 615 may be operated by signal 370. Accordingly, capacitors 631-634 sample input signal with voltage value Vin along with different noise powers N1, N2, N3, and N4 at time points 702-705 respectively.

Assuming that the time difference between two successive time points (702–705) equals Δt, the noise value at the output is given as $$Nout = sqrt[1/16 * ((1+\alpha+\alpha^2+\alpha^3) \times N1 + (1+\alpha+\alpha^2) \times N2 + (1+\alpha) \times N3 + N4)]$$

wherein α represents a correlation factor equaling $e^{(-2\Delta t/\tau)}$, and τ represents a time constant of the noise. From the above it may be appreciated that when Δt is made zero (according to prior approach in FIG. 3A) the α value become 1 (maximum).

When Δt is increased (uncorrelated sampling with time points 702–705 being spaced apart) value of α decreases thereby decreasing the noise at the output.

While the timing diagram of FIG. 7 is described with respect to the circuit diagram of FIG. 6B, it should be appreciated that several concepts are applicable to the circuit diagram of FIG. 6A also. In particular, signals 711–714 may be used to operate switches 611–614 to charge respective capacitors 621–624 for different time durations, as described above. In addition, the circuit of FIG. 6A can be used in a switched capacitor environment also, for example, by providing path 629 as the input to operational amplifier 650 and connecting terminal 628 to Vref by appropriate switches.

The ADCs thus designed can be implemented in various devices. An example device is described below in further detail.

6. Device

Figure 8:
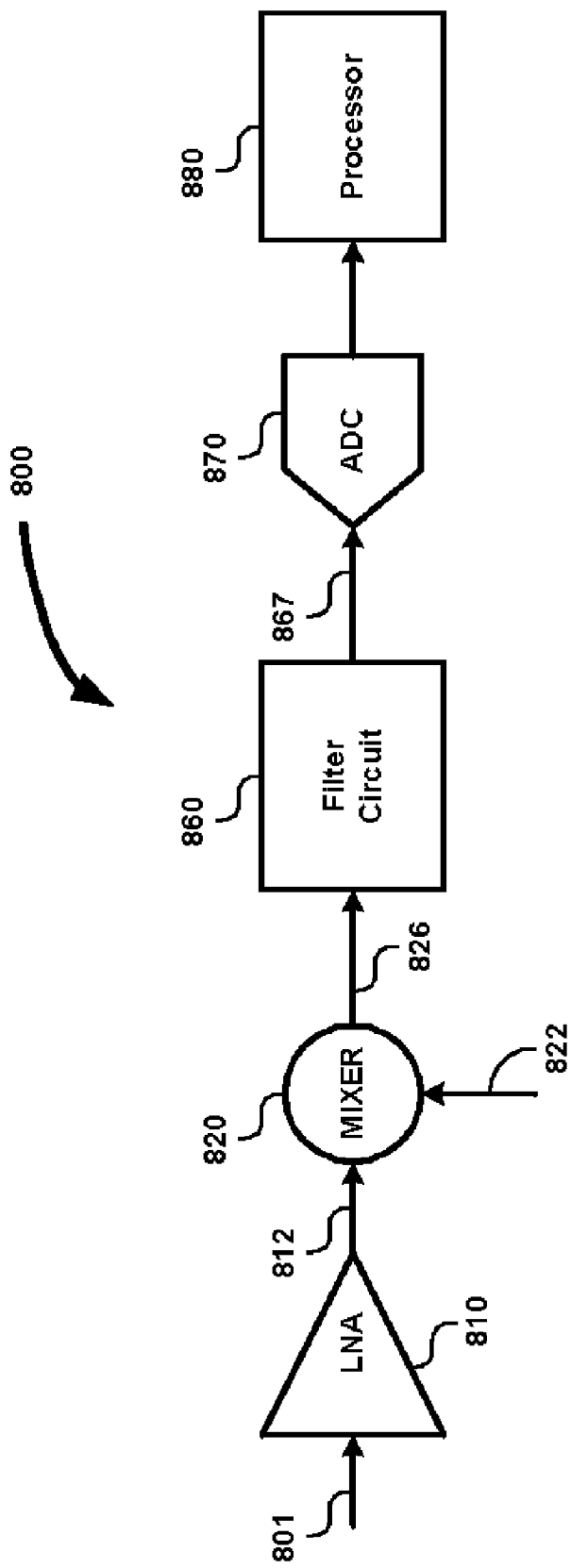
FIG. 8 is a block diagram of receiver system illustrating an example system in which various aspects of the present invention may be implemented.

FIG. 8 is a block diagram of receiver system 800 illustrating an example system in which various aspects of the present invention may be implemented. For illustration, it is assumed that receiver system 800 is implemented within a wireless receiver. However, receiver system 800 can be implemented in other devices (wireless as well as wire-based communications) as well.

Receiver system 800 is shown containing low noise amplifiers (LNA) 810, mixer 820, filter circuit 860, analog to digital converter (ADC) 870, and processor 880. Each block/stage is described in further detail below.

LNA 810 receives signals on path 801 and amplifies the received signals to generate a corresponding amplified signal on path 812. For example, in wireless systems, the signals that are transmitted from satellites, etc. may be received by an antenna (not shown) and the received signals are provided on path 801. The received signals may be weak in strength and thus amplified by LNA 810 for further processing. LNA 810 may be implemented in a known way.

Mixer 820 may be used to down-convert the received amplified signal on path 812 into an intermediate signal with the frequency band of interest centered at a lower frequency than the carrier frequency of the received signal. In an embodiment, a signal with the frequency band of interest centered at 2.4 GHZ (carrier frequency) is converted to a signal with the frequency band of interest centered at zero frequency.

Mixer 820 may receive the amplified signal on path 812 and a signal of fixed frequency on path 822 as inputs, and provides the intermediate signal on path 826. The signal of fixed frequency on path 822 may be generated by a phase locked loop (not shown) in a known way.

Filter circuit 860 may correspond to a low pass filter, which allows the desired low frequencies and rejects all other unwanted high frequencies present in the signal received on line 826. The filtered signal, which contains the frequency band of interest, is provided on path 867.

ADC 870 converts (samples) the filtered signal received on path 867 to a corresponding digital value, which represents the signal of interest in received signal 801. Processor 8 80 processes the received digital values to provide various user applications and may be implemented as multiple processing units, each potentially operating independently. ADC 870 may be implemented using various features described in sections above.

7. CONCLUSION

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of processing an input signal, said method comprising the steps of:
sampling said input signal on capacitive circuits coupled in parallel, each of said capacitive circuits being charged during a respective first overlapping time interval of different duration;
sampling a noise associated with said input signal on each of said capacitive circuits during the respective first overlapping time interval of different duration; the different durations providing different noise levels on each of said capacitive circuits;
holding input signal levels on each of said capacitive circuits as held signals and discharging each of said capacitive circuits during a respective second overlapping time interval;
holding said noise levels on each of said capacitive circuits as held noise levels and discharging each of said capacitive circuits during the respective second overlapping time interval; and
summing said held signals and said held noise levels by said discharging step to an output node as a summed signal and noise;
whereby using overlapping time intervals of different durations in said sampling steps reduces a correlation of said noise levels relative to using time intervals of the same duration.

2. The method of claim 1, wherein said different durations all start at a same time point and each ends at a corresponding different time point.

3. The method of claim 2, wherein said different durations all allow said input signal to settle to a respective desired value on each of said capacitive circuits.

4. The method of claim 3, wherein said capacitive circuits comprise switches and capacitors coupled in series; and said method comprises a further step of switching said summed signal and noise to a switched capacitor amplifier.

5. The method of claim 4, said method further comprising a step of:
generating a plurality of sampling clock signals, to provide said overlapping time intervals of different durations, said clock signals having rising edges at said same time points and respective falling edges at said different time points,
wherein said sampling steps provide each of said plurality of sampling clock signals to a corresponding said capacitive circuit.

6. The method of claim 5, wherein said switched capacitor amplifier and capacitive circuits are used in a stage of an analog to digital converter (ADC); and said sampling steps further comprise sampling said input signal and said associated noise relative to a common mode voltage.

7. A device for processing an input signal comprising:
capacitive circuits coupled in parallel between a first and a second node; said first node coupled to receive said input signal;
a clock generator adapted and configured to generate during a sample phase a plurality of overlapping sampling clock signals, all having a rising edge at a same time point and each having a respective falling edge at a different time point; said clock generator also being adapted and configured to generate during a hold phase at least one holding clock signal, all overlapping;
wherein each said capacitive circuit is configured to sample said input signal and an associated noise during said sampling phase, responsive to a respective one of said sampling clock signals, and is further adapted and configured to hold input signal levels and noise levels and to discharge a summed level to an output during said hold phase, responsive to a respective one of said holding clock signals.

8. The device of claim 7, wherein said processing circuit and capacitive circuits comprise an analog to digital converter (ADC) receiving said input signal.

9. The device of claim 7, wherein said processing circuit and capacitive circuits comprise a sample and hold circuit receiving said and signal.

10. The device of claim 9, wherein said second node, of said capacitive circuits coupled in parallel, couples to said output adapted to receive said summed level from said capacitive circuits; and said output couples to an input of a switched capacitor amplifier.

11. The device of claim 10, wherein said input of said switched capacitor amplifier is configured to couple to a common mode voltage during said sampling phase.

12. The device of claim 11, wherein each of said capacitive circuits comprises switches and capacitors coupled in series and configured to sample said input signal and said associated noise relative to said common mode voltage during said sample phase.

13. A sample and hold (SHA) circuit for processing signals, said SHA circuit comprising:
capacitive circuits coupled in parallel and adapted to receive an input signal;
a clock generator adapted to provide a sample phase and a hold phase, generating overlapping sample clocks of different durations during said sample phase and overlapping hold clocks during said hold phase;
said SHA circuit adapted to sample said input signal and its associated noise signal, charging said capacitive circuits during said sample phase; wherein each of said capacitive circuits is driven by said respective sample clock of different duration; and
said circuit adapted to hold input signal levels and their associated noise levels on said capacitive circuits and to discharge said capacitive circuits during said hold phase; and to output an output level comprising a summed signal level and an associated root mean squared noise level during said hold phase.

14. The SHA circuit of claim 13, wherein said overlapping sample clocks all start at a same time point and each ends at a corresponding different time point; and the SHA circuit further comprises a switched capacitor amplifier adapted to receive a common mode voltage during said sample phase.

15. A circuit for processing an input signal, said circuit comprising:
  capacitive circuits coupled in parallel and adapted to receive said input signal;
  a clock generator adapted to provide a sample phase and a hold phase, generating overlapping sample clocks of different durations during said sample phase and overlapping hold clocks during said hold phase;
  said circuit adapted to sample said input signal and an associated noise, charging said capacitive circuits during said sample phase; wherein each of said capacitive circuits is driven by said respective sample clock of different duration;
  said capacitive circuits adapted to hold respective input signal levels and their associated noise levels and to discharge an output level comprising a summed signal level and an associated root mean squared noise level during said hold phase; and
  an amplifier circuit configured for receiving said output level.

16. The circuit of claim 15, wherein said amplifier circuit comprise a switched capacitor amplifier adapted to receive said output level during said hold phase and to receive a common mode voltage during said sample phase.

17. The circuit of claim 16, wherein said overlapping sample clocks all start at a same time point and each ends at a corresponding different time point.

18. The circuit of claim 17, wherein said capacitive circuits during said sample phase are coupled to a common mode voltage, whereby the sample of said input signal and said associated noise is relative to a common mode voltage.

19. The circuit of claim 17, wherein all said overlapping sample clocks are of a duration allowing said input signal to settle to a desired level.

20. The circuit of claim 19, wherein said capacitive circuits comprise switches and capacitors coupled in series; and said switches are configured to be driven by said respective overlapping sample clocks of different durations to switch said input signal and said associated noise to charge said respective capacitors.

* * * * *